United States Patent [19]

Carr et al.

[11] Patent Number: 5,177,324
[45] Date of Patent: Jan. 5, 1993

[54] IN SITU RF SHIELD FOR PRINTED CIRCUIT BOARD

[75] Inventors: Jonathan D. Carr; David A. Tribbey, both of Boynton Beach; Allen D. Hertz, Boca Raton, all of

[73] Assignee: Motorola, Inc., Schaumburg, Ill.

[21] Appl. No.: 747,090

[22] Filed: Aug. 19, 1991

[51] Int. Cl.⁵ .............................................. H05K 9/00
[52] U.S. Cl. ............................ 174/35 R; 174/35 MS; 361/401; 361/424
[58] Field of Search .................. 428/544, 546, 901; 174/35 R, 35 MS, 250, 260; 361/397, 399, 400, 401, 412, 424

[56] References Cited

U.S. PATENT DOCUMENTS

| | | | |
|---|---|---|---|
| 4,626,963 | 12/1986 | Speer | 361/424 |
| 4,633,122 | 12/1986 | Radice | 310/339 |
| 4,801,489 | 1/1989 | Nakagawa et al. | 428/209 |
| 4,912,604 | 3/1990 | Vaisanen | 361/424 |
| 4,979,019 | 12/1990 | Paquette et al. | 357/80 |
| 5,028,743 | 7/1991 | Kawakami et al. | 174/264 |

Primary Examiner—Leo P. Picard
Assistant Examiner—Bot Ledinh
Attorney, Agent, or Firm—Dale W. Dorinski

[57] ABSTRACT

A printed circuit board providing RF shielding. An electrically insulating material serves as a substrate (10) with two opposed sides. At least one side of the substrate (10) has an electrically conductive layer (12) formed in a pattern that defines a printed circuit. An insulating dielectric layer (14) covers at least a portion of the printed circuitry, leaving at least one portion (16) of the circuitry exposed. A radio frequency (RF) shielding layer (18) is formed by depositing an electrically conductive polymer on at least a portion of the insulating dielectric layer. The RF shielding layer (18) also lies over a portion of the exposed electrical circuitry (16), providing electrical connection to the electrically conductive layer (12). The RF shielding layer (18) is formed from a silverfilled polymer thick film ink and is applied by screen printing, stencilling, roller coating, spraying, or other equivalent methods.

8 Claims, 2 Drawing Sheets

IN SITU RF SHIELD FOR PRINTED CIRCUIT BOARD

TECHNICAL FIELD

This invention relates generally to printed circuit boards, and more particularly to printed circuit boards having RF shields.

BACKGROUND

Many electronic assemblies contain components that are sensitive to radio frequency (RF) signals or that emit RF signals. RF interference, also known as electromagnetic interference (EMI), is an extremely important issue in determining the functionality and proper performance and conformance to regulations of electrical assemblies. Many components in an electronic assembly may emit RF signals and numerous regulations exist that limit the amount or extent of RF emission that may occur from an electrical article. In addition, many devices within the electronic assembly are sensitive to RF signals. In order to comply with regulations and to protect sensitive components from RF interference, RF shields are often placed around the critical components. A radio-frequency (RF) shield is a shield that prevents radiofrequency electromagnetic radiation from entering or leaving or passing through the shield. The shields may be as simple as a single metal housing enclosing the entire electrical assembly or as complex as custommade miniature housings or enclosures for each individual electronic component.

Often, a component must be shielded from electrical interference emanating from inside a printed circuit board itself. In addition to enclosing the component with a covering or a shield, a shield of some sort must be provided underneath the component, that is, between the component and the printed circuit board to shield it from interferences arising from the boards. This type of shielding is typically provided by placing a piece of metal foil, such as copper foil, between the component and the printed circuit board and attaching at least one portion of the metal foil to part of the circuitry on the printed circuit board, typically the ground. If necessary, the metal foil may be insulated by a dielectric or insulating material to avoid shorting between the shield and the printed circuit board or the shield and the component. These types of metal foil shields are typically hand soldered to the printed circuit board. This operation typically occurs after reflow assembly and requires special locating and holding fixtures. Any manual operation requires extra labor, therefore, extra cost is added to the end product. In addition, manual assemblies allow defects to be introduced into the final assembly. Because these soldering operations are difficult to control and can occasionally generate a great deal of heat that damages the printed circuit board and surrounding sensitive components. In addition, any design changes in the component layout will require new shapes or tooling for the metal foil shields. Clearly, the need to employ unique components, extra tooling and fixtures, the high cost of manual operation, generation of assembly defects, and potential damage to the circuitry and surrounding components are all disadvantages of the conventional method of shielding. A shielding method which would eliminate these types of problems would be highly desirable in the printed circuit board industry.

SUMMARY OF THE INVENTION

Briefly, according to the invention, there is provided a printed circuit board that provides RF shielding. An electrically insulating material serves as a substrate with two opposed sides. One side of the substrate has an electrically conductive layer formed in a pattern that defines a printed circuit. An insulating dielectric layer covers at least a portion of the printed circuitry, leaving at least one portion of the circuitry exposed. A radio frequency (RF) shielding layer is formed by depositing an electrically conductive polymer on at least a portion of the insulating dielectric layer. The RF shielding layer also lies over a portion of the exposed electrical circuitry, providing electrical connection to the electrically conductive layer.

DETAILED DESCRIPTION OF THE PREFERRED EMBODIMENT

Figure 1:
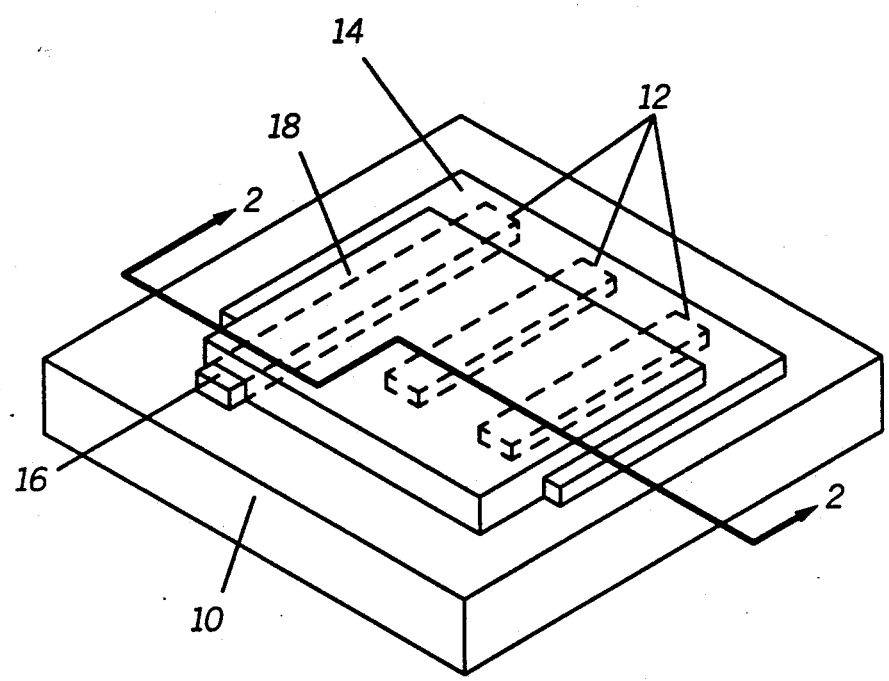
FIG. 1 is an isometric view of a printed circuit board having an RF shield in accordance with the invention.

Referring now to FIG. 1, a printed circuit board consists of a substrate 10 that is an insulating material. The substrate 10 has a layer of electrically conductive material 12 that is typically formed in the pattern of a printed circuit. The electrically conductive material is typically copper and may be plated with materials such as tin, lead, gold, silver, nickel, or additional copper. The electrically conductive layer 12 is then typically covered by a solder mask 14 or other insulating dielectric material. The purpose of the solder mask 14 is to encapsulate or enclose portions of the electrically conductive layer 12 and to isolate the electrically conductive layer from environmental effects. Component mounting pads 16 are left exposed and not covered by the solder mask. This allows components (not shown) to be soldered or attached to the surface mount pads 16 of the printed circuit board 10. An RF shield 18 is applied to the printed circuit board over the solder mask 14 by screen printing, stencilling, roller coating, spraying or photodefining it so that it is integral to and attached to the exposed pads by defining the shield so as to allow it to cover the exposed pad. Typically, the shield is made from a polymer, such as a conductive epoxy that is filled with a metal such as silver. Other metals, such as copper, nickel, gold, platinum, or any other electrically conductive materials, may be used to fill the polymer. Other types of polymers, such as polyesters, polyamides, polyurethanes, liquid crystal polymers, polymer thick film inks, and mixtures of these materials may be used as conductive polymers. A material that has been found particularly suitable for use in fabricating RF shields on printed circuit boards is available from Du Pont Electronic Company of Wilmington, Del. This material is known as "Silver Conductor 5007 Polymer Thick Film" and is typically applied to the printed circuit board by screening the polymer thick film ink onto the board. Silver Conductor 5007 is a seventy-two percent (72%) solids material filled with silver metal and is cured in an oven at one hundred twenty degrees (120° C.) for eight-to-ten minutes or at one hundred forty degrees (140° C.) for one-to-two minutes.

Figure 2:
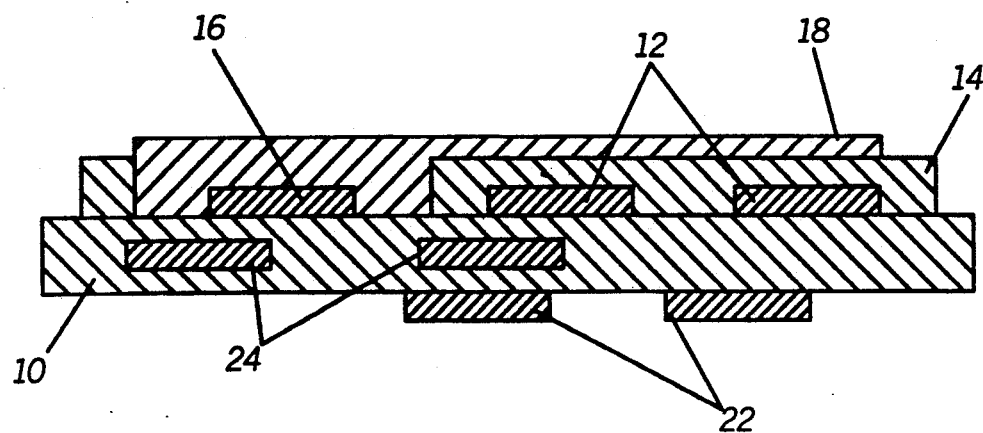
FIG. 2 is a cross-sectional view through section A—A of FIG. 1.

Referring to FIG. 2, a shield printed circuit board may be made by utilizing a substrate having more than one conductive layer. The substrate 10 may contain an additional layer 22 that is on the opposite side of the substrate. This is known as a double-layer construction or a twosided printed circuit. Additional layers may be added by embedding conductive layers 24 within the interior of the substrate 10. This is performed by techniques well known to the printed circuit board industry, and is commonly known as a multi-layer board. In cases where a multi-layer board is used, the use of an in situ RF shield as practiced herein, allows a designer to eliminate one of the layers, thereby reducing the size, complexity, and cost of the printed circuit board.

Figure 3:
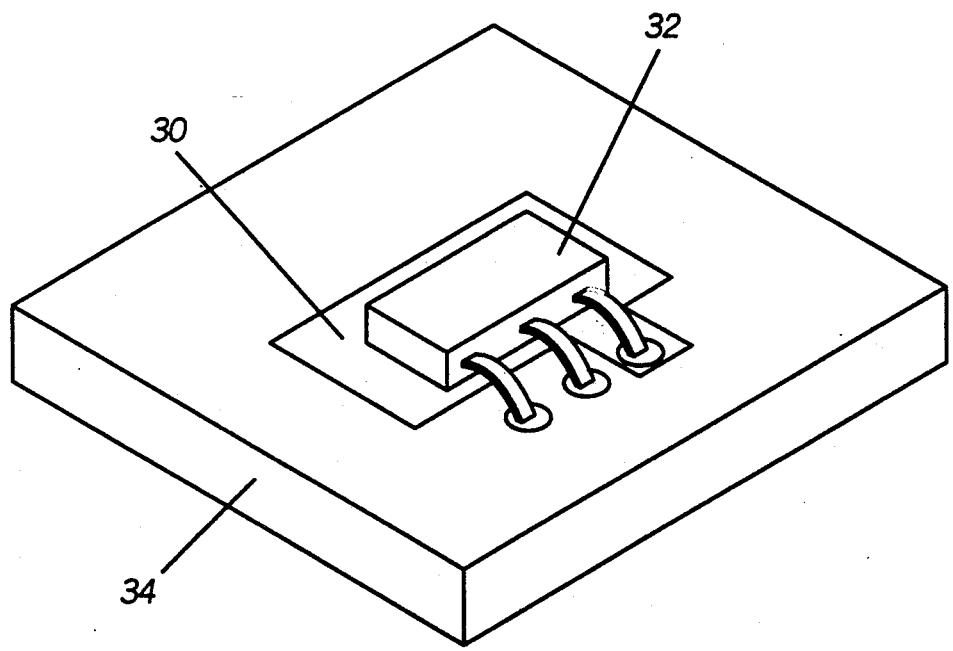
FIG. 3 is an isometric view of a further embodiment of the invention.

When an electronic assembly (FIG. 3) is fabricated using the instant invention, an RF sensitive component 32 is mounted or soldered to the printed circuit board 34 over the RF shield 30. As an example of such an assembly, eight selective call receivers or pagers were assembled using conventional technology and also using the screened in place silver conductor. The eight pagers using conventional technology had a copper foil shield soldered to the printed circuit board in the required areas. The eight experimental pagers utilized the Du Pont Silver Conductor 5007 screened in place in the required areas to form an in situ shield. Each of the sixteen pagers were tested after assembly for paging sensitivity. The average sense value of the control group was 19.0 db with a standard deviation of 0.6 db. The average sense value of the eight pagers assembled according to the invention, was 19.2 db with a standard deviation of 0.4 db. Statistical analysis of the data shows that there was no significant difference between the control group and the group made with a circuit based in accordance with the invention. It has been determined that the cost for adding an RF shield using the conventional technology is approximately One ($1.00) Dollar including parts and labor, whereas the cost for an equivalent unit assembled in accordance with the invention is approximately fifteen (15¢) cents. It is clear that a significant advantage accrues to pagers and other electronic units assembled using the technology of the invention, while no disadvantage may be found in the electrical performance.

In summary, a printed circuit board may be fabricated with an integral or in situ RF shield that provides equivalent performance to conventional technology at a significantly reduced cost. The cycle time to produce an assembly is reduced and defects arising from human error and during manual assembly are also eliminated. Printed circuit boards with integral RF shields made in accordance with the invention may be made for approximate one-tenth of the cost of those made using conventional technology.

The configurations and descriptions of the RF shielded printed circuits shown in FIGS. 1 and 2 are intended to convey the concept of the present invention and similar and other RF shield designs employing shields formed as an integral part of the substrate may certainly be envisioned by one skilled in the art to fall within the scope of the invention, for example, the use of a low resistance polymer thick film ink, multiple RF shields on a single substrate, RF shields on both sides of the substrate, double-sided or multi-layer substrates, etc.

Accordingly, it is not intended that the present invention be limited except as by the appended claims herein.

What is claimed is:

1. A printed circuit board providing RF shielding, comprising:
   an electrically insulating substrate having two opposed sides;
   an electrically conductive layer disposed on at least one side of the substrate in a pattern to define a printed circuit;
   an insulating dielectric layer disposed on at least a portion of the first layer; and
   a RF shielding layer, comprising:
      an electrically conductive polymer intimately disposed on portions of the insulating dielectric layer and the electrically conductive layer, providing electrical connection to a portion of the electrically conductive layer and RF shielding to another portion of the electrically conductive layer,
   the RF shielding layer not covered by any other insulating layer.

2. The printed circuit board as described in claim 1, wherein the electrically conductive polymer is selected from the group consisting of epoxies, polyamides, polyimides, polyesters, polyurethanes, liquid crystal polymers, and mixtures thereof.

3. The printed circuit board as described in claim 1, wherein the electrically conductive polymer is filled with metal.

4. The printed circuit board as described in claim 1, wherein the RF shielding layer comprises a polymer thick film ink applied over at least a portion of the insulating dielectric layer and a portion of the electrically conductive layer.

5. The printed circuit board is described in claim 1, further comprising another electrically conductive layer embedded within the substrate.

6. A printed circuit assembly, comprising:
   a printed circuit board providing RF shielding, comprising:
   an electrically insulating substrate having two opposed sides;
   an electrically conductive layer disposed on at least one side of the substrate in a pattern to define a printed circuit;
   an insulating dielectric layer disposed on at least a portion of the first layer;
   a RF shielding layer, comprising:
      an electrically conductive polymer intimately disposed on portions of the insulating dielectric layer and the electrically conductive layer, providing electrical connection to a portion of the electrically conductive layer and RF shielding to another portion of the electrically conductive layer, and;
   the RF shielding layer not covered by any other insulating layer; and;
   at least one electrical component emitting an RF signal or sensitive to RF interference, soldered to the printed circuit board over the RF shielding layer.

7. The printed circuit assembly as described in claim 5, wherein the conductive polymer is a silver-filled polymer thick film ink.

8. The printed circuit assembly as described in claim 5, wherein the conductive polymer is a silver-filled epoxy.

* * * * *